United States Patent [19]

Rougeot

[11] 4,122,345

[45] Oct. 24, 1978

[54] SEMICONDUCTOR DETECTOR FOR DETECTING IONIZING RADIATION

[75] Inventor: Henri Rougeot, Paris, France

[73] Assignee: Thomson-CSF, Paris, France

[21] Appl. No.: 773,834

[22] Filed: Mar. 2, 1977

[30] Foreign Application Priority Data

Mar. 9, 1976 [FR] France .................... 76 06717

[51] Int. Cl.$^2$ ............................. G01T 1/22
[52] U.S. Cl. .................................. 250/370
[58] Field of Search ............ 250/370, 371, 361 R, 250/367; 204/195 R; 429/111

[56] References Cited

U.S. PATENT DOCUMENTS 3,129,148  4/1964  Steinbrecher et al. ...... 204/195 R X
3,628,017  12/1971  Lerner .................. 250/370 X
4,029,962  6/1977  Chapman ................ 250/370 X Primary Examiner—Davis L. Willis
Attorney, Agent, or Firm—Roland Plottel

[57] ABSTRACT

The invention relates to a semiconductor detector for detecting ionizing radiation. The surface barrier required for the formation of field zones in the semiconductor body (1) is created by contact between the semiconductor body (1) and an electrolyte (3) in which it is immersed. In addition, the body is cut out, in the form of a comb in the example, in such a way as to increase its active surface as much as possible. The source (8) maintains the potential difference $V_o$ between the contact (5) on the body (1) and the cathode (7). The output signal $s$ is extracted at (6).

9 Claims, 3 Drawing Figures

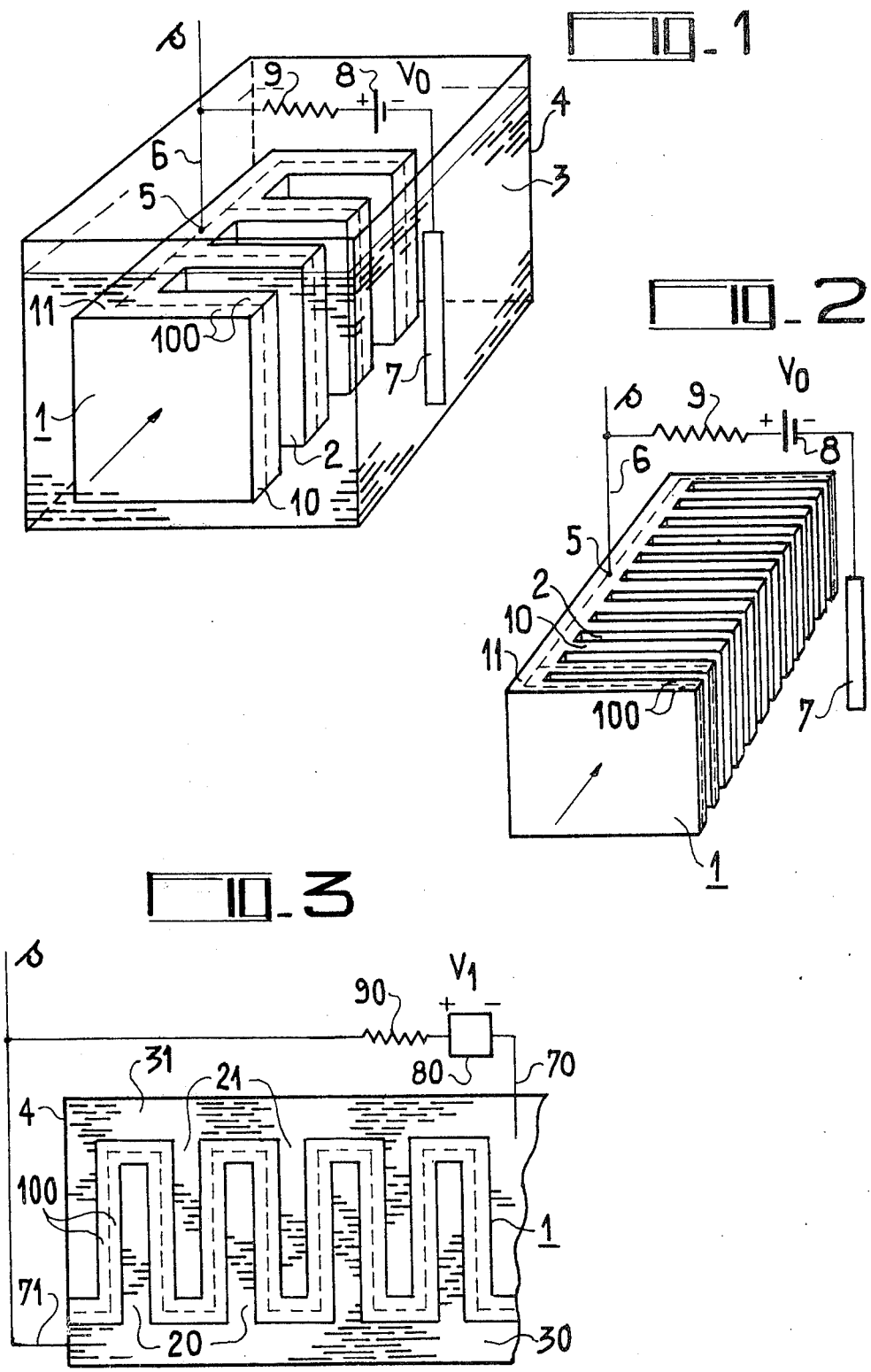

SEMICONDUCTOR DETECTOR FOR DETECTING IONIZING RADIATION

This invention relates to a detector for detecting ionizing X, α, β or γ radiation using a semiconductor body.

Semiconductor detectors consist of a crystallised semiconductive or semi-insulating body in which an electrical field is created by means of contacts between which a potential difference is maintained. When a pulse of the ionizing radiation reaches this body, it results in the ionization of its molecules and the liberation of charges which travel in this field. Collected by the electrodes, these charges supply a signal by which the incident radiation is detected.

For a given incident ionizing pulse, the quantity of these charges depends upon the effectiveness of their collection by the detector which itself is determined inter alia on the one hand by the absorbing power of the semiconductor body for the incident radiation and, on the other hand, by the volume of this body affected by the movement of the charges in question, i.e. by the size of the field zone created in the body by the potential difference applied.

To render this quantity as large as possible, it is therefore necessary to look for semiconductor materials which, on the one hand, are highly absorbent and in which, on the other hand, this field zone is as large as possible.

In order to satisfy the second of these two conditions, it is necessary to use high-purity semiconductor materials, i.e. semiconductor materials with a very low density of free carriers, of the order of $10^{12}$ per cubic centimeter, the field zones, or space charge zones, in question being larger, the greater this purity, for a given potential difference applied between the electrodes.

In order to satisfy the first requirement, it is necessary to choose semiconductor materials with a high density or a high atomic number.

Now, in the present state of the art, only simple bodies, such as silicon or germanium, are capable of being produced in the very high purity required. However, since silicon is a lightweight material, it is only weakly absorbing to the incident radiation, whilst germanium has to be cooled in operation for reducing the so-called dark current, i.e. the current of charges in the absence of any incident radiation.

On the other hand, heavy materials, such as gallium arsenide, cadmium telluride and mercury iodide, to mention only the principal representatives, are difficult to produce in the degree of purity required.

It follows from this that it is hardly possible, in the present state of the art, to exceed a certain effectiveness of collection.

In order to improve the effectiveness of collection in the structures according to the invention, there is associated with the semiconductor body an electrolyte such as, for example, an aqueous potassium bichromate solution or an alcoholic solution in which the semiconductor body is immersed.

Hereinafter, the term semiconductor is exclusively used for designating the solid component of the detectors according to the invention, on the understanding that this solid component may also be a semi-insulating body which is only a variety thereof.

The invention utilises the property of these substances, when immersed in a liquid electrolyte, of presenting a surface barrier at the interface with the liquid. This barrier is endowed with the Schottky effect and rectifies an alternating current flowing in the electrolyte-solid interface. In particular, if the electrolyte is negatively polarised in relation to an n-type solid, there appears in the solid, from its faces in contact with the liquid, a space charge zone of which the size is moreover dependent upon the purity of the solid, as mentioned above.

By this immersion, it is possible, by forming a large number of indentations or notches in the semiconductor body, considerably to increase the contact surface between the solid and the electrolyte and, hence, the total active volume of the detector. By adding the signals of all the component volumes thus created in the semiconductor block, there is obtained a considerable increase in the signal corresponding to a given incident pulse under the conditions which will be explained hereinafter. This is one of the advantages of the structures according to the invention. In addition, contrary to the prior art, no surface barrier has to be provided on the semiconductor body which makes the construction of the detector more simple.

Finally, it is possible, as will be seen hereinafter, by mixing a scintillator with the electrolyte further to improve the detecting properties of the structures according to the invention, especially in the case of solids which are weakly absorbing to the incident ionizing radiation, such as the silicon mentioned above.

The invention will be better understood from the following description in conjunction with the accompanying drawings, wherein:

FIG. 1 is a diagrammatic perspective view of one variant of the detector according to the invention.

FIG. 2 is a diagrammatic perspective view of part of another variant of the detector according to the invention.

FIG. 3 shows a variant of one of the constituent parts of the detectors according to the invention.

FIG. 1 shows by way of non-limiting example one variant of a detector according to the invention. A semiconductor body 1, consisting in the example of an n-type silicon monocrystal, with indentations 2 separating teeth 10 is immmersed in an electrolyte 3, of which the detailed composition will be given hereinafter, accommodated in a cell 4. The teeth of the comb thus formed and its back 11 carry ohmic contacts globally represented by the point bearing the reference 5.

An anode connection denoted by the reference 6 in the Figure is welded to these contacts. Into the electrolyte 3 dips a cathode 7 which is the second electrode of a circuit closed on the electrolyte and which is fed by the d.c. voltage source shown at 8 supplying the voltage $V_o$ across the resistor 9. The cell 4 containing the electrolyte is made in such a way that at least its face which is exposed to the incident X, α, β or γ radiation, represented by the arrow, is transparent to that radiation. The anode contact, in that part thereof which is in contact with the electrolyte, is insulated from the electrolyte by a coating (not shown).

The output signal s corresponding to an ionizing pulse is collected at the anode connection 6.

The space charge zones 100 created in the semiconductor by the applied voltage $V_o$ extend from its faces in contact with the electrolyte over a depth which, as mentioned, depends upon its purity, i.e. upon its content of free carriers, and which is greater, the greater this purity. In the case of the silicon of the present example, which it is known to produce in a high degree of purity ($10^{12}$ free carriers per cubic centimeter), this depth is fairly considerable and leads to thick teeth, each of these teeth and the back of the comb comprising two such zones separated from one another by a central interval of which the median plane is represented by the broken line in the drawing. The thickness of the teeth, i.e. their dimension perpendicularly of their large faces, and that of the back are selected in such a way as to limit this interval to the minimum value necessary for separating these two zones from one another, so that virtually the entire thickness of the semiconductor body affected by the phenomenon of ionization under the effect of the incident radiation is under the space charge conditions. For the silicon of the example, with a purity of $10^3$ to $10^4$ ohms.cm, and for a bias voltage $V_o$ of 20V, this thickness amounts to 300 μm. The thickness of the indentations 2, i.e. their dimension parallel to the preceding thickness, amounts to 100 μm.

Since moreover silicon is weakly absorbing to the incident rays, an organic scintillator in liquid form, such as anthracene, naphthacene or triphenyl, is dissolved to an extent of 20% to 50% by volume in the electrolyte 3 consisting of a solution of a solvent, such as an ethyl or methyl alcohol or even chlorethylene, and of a solute such as an amine or amide, (5 to 10% by volume) and having a conductivity of a few $10^{-5}$ mhos. Under the effect of the ionizing rays, the scintillators emit light in the 350–430 nm range which, largely absorbed by the photosensitive semiconductor 1, results in the ionization thereof, irrespective of its emission angle.

FIG. 2 corresponds to another example of embodiment of the invention in which the semiconductor body used is gallium arsenide of which the absorbing power for these ionizing rays is very considerably higher than that of the silicon of the preceding example, but for which the maximum degree of purity obtainable in the present state of the art is lower.

The material has a density of free carriers of the order of $10^{14}$ to $10^{17}$ per cubic centimeter.

In this case, the space charge zones have a lower depth than in the preceding example which makes it necessary to select teeth having a thickness not exceeding about 30 micrometers. FIG. 2 shows the same elements with the same references as in FIG. 1, except for the cell and the electrolyte.

Finally, FIG. 3 is a plan view of another form of cutting of the semiconductor body 1 of the detectors according to the invention. The semiconductor body is cut out in a meander-like pattern. The reference 20 denotes one of the series of indentations formed in the body 1 whilst the reference 21 denotes the other series.

The body is immersed in an electrolyte as in the preceding examples, but on this occasion in such a way as to separate the electrolyte into two parts 30 and 31 without any communication between them. To this end, the body 1 is applied in fluid-tight manner to four of the faces of the cell of insulating material, the lower and upper faces and the two left-hand and right-hand faces (of which the righthand face is not shown) in the case of the Figure.

The advantage of this arrangement is that it has an increased solid-electrolyte contact surface, as in the case of these examples. In addition, the meander-like body and the two electrolytes constitute a three-electrode structure which may be used according to the invention as an amplifier in accordance with the diagram indicated in the Figure. The semiconductor body 1 constitutes the base of a transistor of which the source is formed by the part 30 of the electrolyte bath and the collector by the part 31. The circuit arrangement is that diagrammatically illustrated in the Figure where 70 and 71 are two electrodes dipping into the electrolyte, 90 is a resistor and 80 the voltage source (voltage $V_1$) of the circuit of the collector. The signal s is extracted at the connection of the electrode 71.

Generally, the detectors according to the invention have the same applications as conventional detectors. Like conventional detectors, they are used in the nuclear field, especially for detecting electromagnetic radiation and high energy electrons. By virtue of the increase in the signal corresponding to a given ionizing pulse, they permit the detection of incident radiation at lower levels than prior art detectors and, in particular, provide for a finer spectrography of this radiation.

Of course, the invention is not limited to the embodiments described and shown, which were given solely by way of example.

What is claimed is:

1. A semiconductor detector for detecting ionizing radiation using a semiconductor body comprising surface barriers on certain of its faces and means for creating from these faces field zones where an electrical field prevails in operation, said detector additionally comprising means for detecting the signal resulting, in operation, from the movement in said field zones of free charges produced in the semiconductor by the incident ionizing radiation, wherein said surface barriers are those created at the interface between said semiconductor and an electrolyte bath with which it is in contact, wherein a scintillator which converts the incident ionizing radiation into a luminous radiation absorbed by said semiconductor body and producing ionization therein is dissolved in said electrolyte bath, and wherein said semiconductor body is in the form of a block formed with a series of indentations bathed by said electrolyte bath.

2. An ionizing radiation detector as claimed in claim 1, wherein said electrolyte bath consists of an aqueous potassium bichromate solution.

3. An ionizing radiation detector as claimed in claim 1, wherein said semiconductor body is made of silicon.

4. An ionizing radiation detector as claimed in claim 1, wherein said scintillator consists of naphthacene.

5. An ionizing radiation detector as claimed in claim 1, wherein said semiconductor body is cut in the form of a comb.

6. An ionizing radiation detector as claimed in claim 5, wherein said comb is completely immersed in said electrolyte bath.

7. An ionizing radiation detector as claimed in claim 6, wherein said semiconductor body is of n-type and wherein said means for creating said field zones consist of a contact applied to said semiconductor body connected through a resistor to the + terminal of a d.c. voltage source and of an electrode dipping into said electrolyte bath and connected to the − terminal of said source, said signal being extracted at said contact.

8. An ionizing radiation detector as claimed in claim 1, wherein said semiconductor body is cut in the form of a meander and separates said electrolyte bath into two noncommunicating parts.

9. An ionizing radiation detector as claimed in claim 8, wherein said means for creating said field zones consist of a first electrode connected to the − terminal of a d.c. voltage source and dipping into one of the parts of said electrolyte bath and of a second electrode dipping into the other of said parts and connected through a resistor to the + terminal of said voltage source, said signal being extracted at said second electrode.

* * * * *